US011680334B2

(12) United States Patent
MacDonald

(10) Patent No.: US 11,680,334 B2
(45) Date of Patent: *Jun. 20, 2023

(54) METHOD OF AUTOMATICALLY MEASURING SEED MELT BACK OF CRYSTALLINE MATERIAL

(71) Applicant: CRYSTAL SYSTEMS, LLC, Missoula, MT (US)

(72) Inventor: John T. MacDonald, Reading, MA (US)

(73) Assignee: CRYSTAL SYSTEMS, LLC, Missoula, MT (US)

(*) Notice: Subject to any disclaimer, the term of this patent is extended or adjusted under 35 U.S.C. 154(b) by 0 days.

This patent is subject to a terminal disclaimer.

(21) Appl. No.: 17/500,814

(22) Filed: Oct. 13, 2021

(65) Prior Publication Data

US 2022/0090289 A1 Mar. 24, 2022

Related U.S. Application Data

(63) Continuation of application No. 16/671,705, filed on Nov. 1, 2019, now Pat. No. 11,174,567, which is a continuation of application No. 14/488,476, filed on Sep. 17, 2014, now Pat. No. 10,494,733.

(60) Provisional application No. 61/884,286, filed on Sep. 30, 2013.

(51) Int. Cl.
| C30B 11/00 | (2006.01) |
| C30B 29/20 | (2006.01) |
| C30B 29/06 | (2006.01) |
| C30B 11/14 | (2006.01) |

(52) U.S. Cl.
CPC ............ *C30B 11/00* (2013.01); *C30B 11/007* (2013.01); *C30B 11/14* (2013.01); *C30B 29/06* (2013.01); *C30B 29/20* (2013.01)

(58) Field of Classification Search
CPC ....... C30B 11/00; C30B 11/007; C30B 11/14; C30B 29/06; C30B 29/20; Y10T 117/1032; Y10T 117/1072
See application file for complete search history.

(56) References Cited

U.S. PATENT DOCUMENTS

| 4,412,577 A | 11/1983 | Salkeld |
| 4,926,357 A | 5/1990 | Katsuoka et al. |
| 5,932,002 A | 8/1999 | Izumi |
| 5,935,321 A | 8/1999 | Chiou et al. |
| 6,022,411 A | 2/2000 | Kuramoto |

(Continued)

FOREIGN PATENT DOCUMENTS

JP 02-064089 3/1990

OTHER PUBLICATIONS

International Search Report dated Dec. 23, 2014 issued in connection with PCT/US2014/056033.

*Primary Examiner* — Robert M Kunemund
(74) *Attorney, Agent, or Firm* — Behmke Innovation Group LLC; James M. Behmke; Jonathon P. Western

(57) ABSTRACT

A method and apparatus for measuring a melt back of a seed in a boule are provided. The method includes lifting a boule once it has been produced using an actuating device onto a support table to automatically manipulate the boule from a furnace to the support table. The melt back of the seed is then automatically measured using a vision system that is installed on an imaging device disposed below the boule.

20 Claims, 3 Drawing Sheets

(56) References Cited

U.S. PATENT DOCUMENTS

| | | |
|---|---|---|
| 6,139,632 A | 10/2000 | Izumi |
| 6,325,851 B1 | 12/2001 | Onoue |
| 6,464,777 B2 | 10/2002 | Kitamura et al. |
| 8,187,378 B2 | 5/2012 | Takanashi |
| 9,096,945 B2 | 8/2015 | Mikawa et al. |
| 9,260,796 B2 | 2/2016 | Hoshi et al. |
| 9,428,843 B2 | 8/2016 | Quinton et al. |
| 9,518,337 B2 | 12/2016 | Mikawa et al. |
| 10,494,733 B2 * | 12/2019 | MacDonald ............ C30B 11/14 |
| 11,174,567 B2 * | 11/2021 | MacDonald ............ C30B 11/14 |
| 2001/0001944 A1 | 5/2001 | Kitamura et al. |
| 2002/0029735 A1 | 3/2002 | Terao et al. |
| 2004/0221794 A1 | 11/2004 | Takanashi et al. |
| 2007/0125299 A1 | 6/2007 | D'Souza et al. |
| 2008/0282972 A1 | 11/2008 | D'Souza et al. |
| 2009/0064923 A1 | 3/2009 | Takanashi |
| 2010/0024717 A1 | 2/2010 | Orschel et al. |
| 2010/0064964 A1 | 3/2010 | Hoshi et al. |
| 2010/0319613 A1 | 12/2010 | Fujiwara et al. |
| 2011/0017125 A1 | 1/2011 | Sugawara et al. |
| 2011/0100292 A1 | 5/2011 | Uematsu et al. |
| 2011/0179992 A1 | 7/2011 | Schwerdtfeger, Jr. et al. |
| 2011/0274609 A1 | 11/2011 | Shimodaira et al. |
| 2013/0108537 A1 | 5/2013 | Mikawa et al. |
| 2014/0186631 A1 | 7/2014 | Chou |
| 2014/0271436 A1 | 9/2014 | Quinton et al. |
| 2015/0247256 A1 | 9/2015 | Mikawa et al. |

* cited by examiner

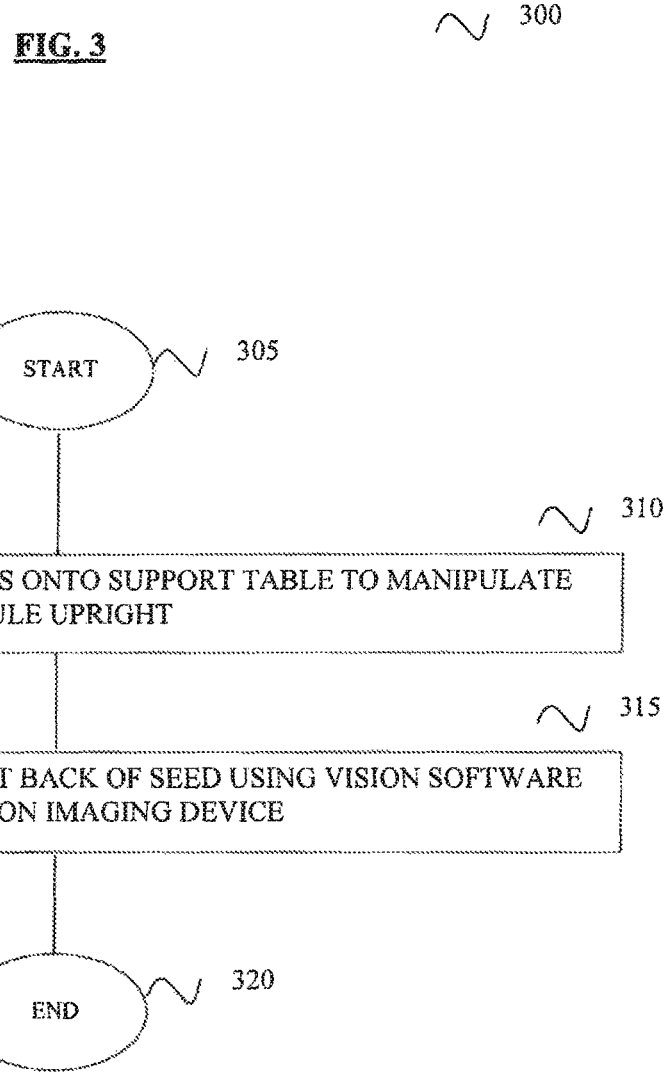

METHOD OF AUTOMATICALLY MEASURING SEED MELT BACK OF CRYSTALLINE MATERIAL

CROSS-REFERENCE TO RELATED APPLICATION

The present application is a continuation of U.S. patent application Ser. No. 16/671,705, filed on Nov. 1, 2019 now U.S. Pat. No. 11,174,567, and U.S. patent application Ser. No. 14/488,476, filed on Sep. 17, 2014, now U.S. Pat. No. 10,494,733, which claim the benefit of U.S. Patent Application No. 61/884,286, filed Sep. 30, 2013, all entitled METHOD OF AUTOMATICALLY MEASURING SEED MELT BACK OF CRYSTALLINE MATERIAL, by John T. Mac Donald, the entire contents of which are incorporated herein by reference.

BACKGROUND

1. Field of the Invention

The present invention relates to the automatic measurement of seed melt back of a produced crystalline material.

2. Description of the Related Art

Crystal growth apparatuses or furnaces, such as directional solidification systems (DSS) and heat exchanger method (HEM) furnaces, involve the melting and controlled resolidification of a feedstock material, such as alumina or silicon, in a crucible to produce an ingot. Production of a solidified ingot from molten feedstock occurs in several identifiable steps over many hours. For example, to produce an ingot, such as a sapphire ingot, by the HEM method, solid feedstock, such as alumina, is provided in a crucible containing a monocrystalline seed (which comprises the same material as the feedstock but with a single crystal orientation throughout) placed into the hot zone of a solidification furnace. A heat exchanger, such as a helium-cooled heat exchanger, is positioned in thermal communication with the crucible bottom and with the monocrystalline seed. The feedstock is then heated to form a liquid feedstock melt, without substantially melting the monocrystalline seed, and heat is then removed from the melted feedstock by applying a temperature gradient in the hot zone in order to directionally solidify the melt from the unmelted seed. By controlling how the melt solidifies, a crystalline material having a crystal orientation corresponding to that of the monocrystalline seed, and having greater purity than the starting feedstock material, can be achieved.

However, during the melt phase, in some circumstances the seed melts beyond a predetermined threshold, causing an undesired or unexpected crystallographic structure. Therefore, to improve the error rate of such unexpected crystallographic structure, a melt back of the seed is usually measured. This measurement is often referred to as a seed melt back. These measurements are generally performed manually by illuminating the boule, such as from the side, top, or bottom, and using tools such as vernier calipers to estimate the melt back of the seed. However, manual measurements lead to human error and are typically very inefficient in crystalline material production.

SUMMARY

In an exemplary embodiment of the present invention that automatically measures the seed melt back of a boule, the boule may be lifted with an actuating device onto a support table to automatically manipulate the boule from the furnace to the support table. Once the boule is lifted, the melt back of the seed within the boule may be automatically measured using a vision system installed on an imaging device disposed below a bottom of the boule. The melt back measurement of the seed may be transmitted to a controller to adjust a temperature within the furnace. In addition, in response to measuring the melt back of the seed, the controller may determine whether the measured melt back has a predetermined diameter. The predetermined diameter may be a range from about 2.7 to about 3.1 inches, and more preferably may be about 2.9 inches when the seed is about 3.3 inches in diameter. In response to determining that the measured melt back is the predetermined diameter, the method may include cutting the boule into a plurality of wafers, and determining whether the boule has a determined crystallographic structure based on the measure seed melt back. More specifically, the method may include determining whether the boule has a monocrystalline structure based on the measured seed melt back.

In some embodiments of the present invention, the actuating device that lifts the boule may be a pair of automated lifting tongs that is capable of lifting a boule that weights up to about 650 lbs. In addition, the boule may be a sapphire crystal boule or a silicon boule without departing from the overall intent of the present invention.

In another exemplary embodiment of the present invention, an apparatus may be configured to measure a melt back of the seed within a boule. The apparatus may include a crucible disposed within the apparatus that is configured to receive a seed to produce a boule and a solid feedstock material. In addition, an actuating device may be configured to lift the boule, once the boule is produced, onto a support table to automatically manipulate the boule from a furnace to the support table. Additionally a vision system may be installed on an imaging device disposed below the boule and may then be configured to automatically measure the melt back of the seed within the boule.

BRIEF DESCRIPTION OF THE DRAWINGS

The embodiments herein may be better understood by referring to the following description in conjunction with the accompanying drawings in which like reference numerals indicate identically or functionally similar element, of which:

FIG. 3 illustrates an exemplary simplified procedure of automatically measuring the seed melt back of a sapphire boule according to an exemplary embodiment of the present invention.

DETAILED DESCRIPTION

Figure 1:
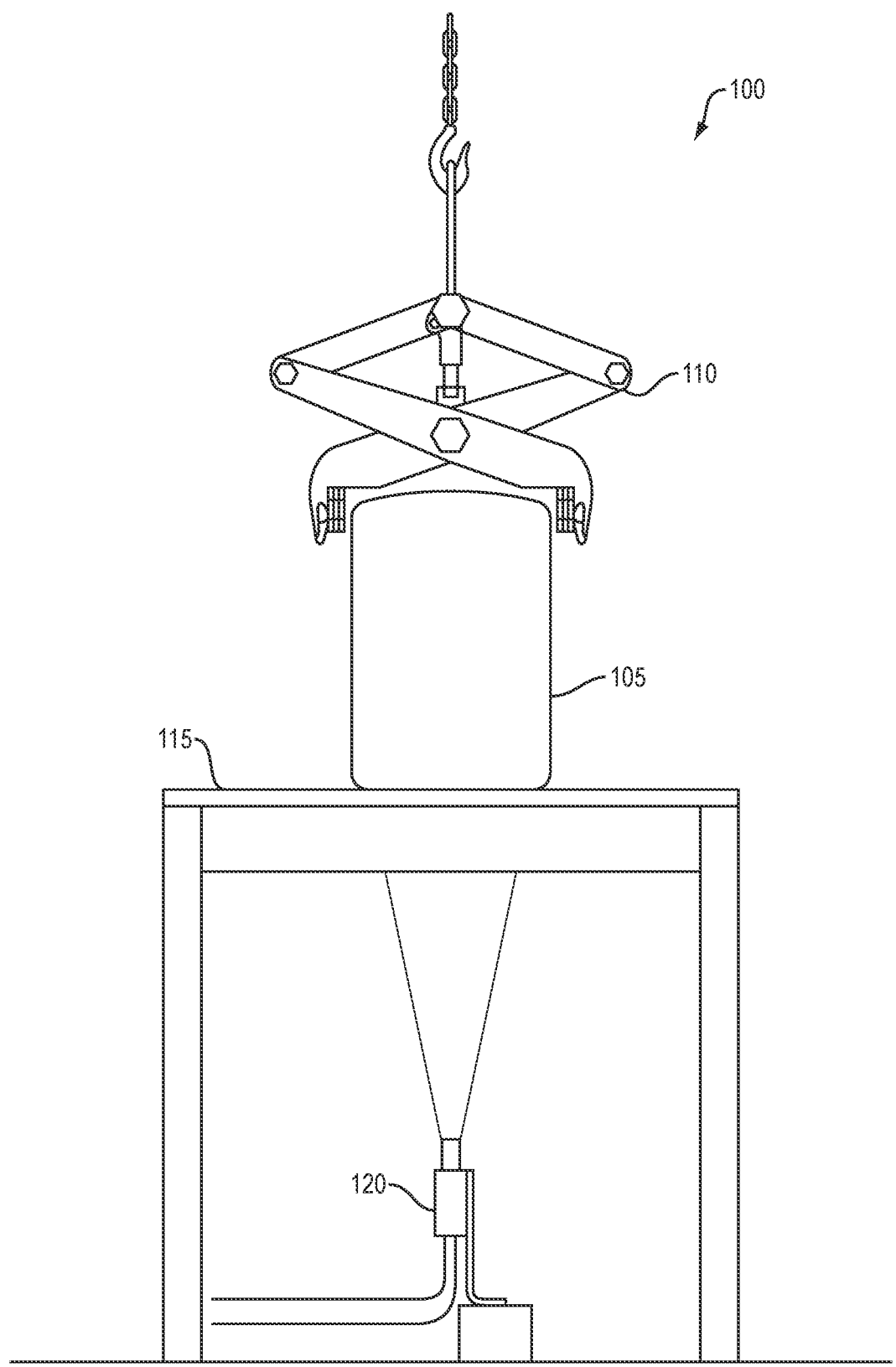
FIG. 1 illustrates an exemplary schematic of an automatic measurement system according to an exemplary embodiment of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

In the following detailed description, reference is made to the accompanying drawings, which for a part hereof. In the drawings, similar symbols typically identify similar components, unless context dictates otherwise. The illustrative embodiments described in the detailed description, drawings, and claims are not meant to be limiting. Other embodiments maybe utilized, and other changes may be made, without departing from the spirit or scope of the subject matter presented herein. It will be readily understood that the aspects of the present invention, as generally described herein, and illustrated in the Figures, can be arranged, substituted, combined, separated, and designed in a wide variety of different configurations, all of which are explicitly contemplated herein. Further, in the following description, numerous details are set forth to further describe and explain one or more embodiments. These details include system configurations, block module diagrams, circuit diagrams, flowcharts, and accompanying written description. While these details are helpful to explain one or more embodiments of the invention, those skilled in the art will understand that these specific details are not required in order to practice the embodiments.

An exemplary embodiment herein provides a technique for automatically measuring a seed melt back of a boule. The boule, e.g., a sapphire boule, may be produced in a crystal growth furnace prior to measuring the melt back of the seed within the boule and the crystal growth apparatus may be a high-temperature furnace that heats and melts a solid feedstock material and subsequently re-solidifies the molten feedstock material to form the crystalline boule. Specifically, the material to be melted may be a solid feedstock material e.g., alumina and a seed, for example, a monocrystalline seed, to produce a crystalline material that is monocrystalline or substantially monocrystalline in structure. The seed itself may be placed in substantially the middle of a non-rotatable and stationary crucible within the furnace. The crucible may be made of various heat resistant materials such as quartz (silica), graphite, molybdenum, silicon carbide, silicon nitride with silica, pyrolytic boron nitride, alumina, or zirconia and, optionally, may be coated with for example silicon nitride to prevent sticking during solidification. The crucible may have various shapes that have at least one side and a bottom such as a cylindrical, cubic, cuboid (e.g., square cross-section), or tapered shape.

In particular, according to an exemplary embodiment of the present invention, as shown in FIG. 1, a crystal growth apparatus 100 (e.g., a furnace) may include a crucible disposed therein configured to receive a seed to produce a boule 105. Actuating device 110 may be configured to lift boule 105, produced, for example, in a crystal growth apparatus, (e.g., a furnace) including a crucible disposed therein configured to receive a seed, onto a support table 115. The actuating device 110 may be, for example, a pair of automated lifting tongs that may be capable of lifting a boule of up to about 650 lbs. In particular, the automated lifting tongs may be configured to clamp the boule 105 to automatically manipulate the boule onto the support table. In addition, once the boule 105 has been lifted to the support table, a vision system that is installed on an imaging device 120 (e.g., a camera, a video recorder, etc.) disposed below the boule may be configured to automatically measure a melt back of the seed. The vision system may be any vision software known to a person skilled in the art and may include vision software capable of discerning the shape and/or area of the remaining seed.

Moreover, the melt back of the seed within the boule is measured to improve the quality of subsequently produced boules by reducing any cracks or deformations caused by a seed being melted beyond a predetermined range. A controller (not shown) may also be used to determine whether the measured melt back is a predetermined diameter and may be configured to determine whether the boule has a determined crystallographic structure based on the measured melt back. Specifically, when the seed is insufficiently melted, cracking may occur due to the flaws created in the boule crystal structure. Therefore, the boule may no longer have a monocrystalline structure. In addition, when the melt back of the seed is beyond the predetermined range (e.g., the seed has melted back beyond a sufficient point), the seed may form a dome shape that causes grain dislocation and imperfections within the boule. Typically, the seed used in a crystalline growth apparatus has a diameter of about 3.3 inches. During the growth process, it is preferable that the seed melt back remain within a range of about 2.7 to about 3.1 inches, and more preferably the seed melt back is about 2.9 inches.

Figure 2:
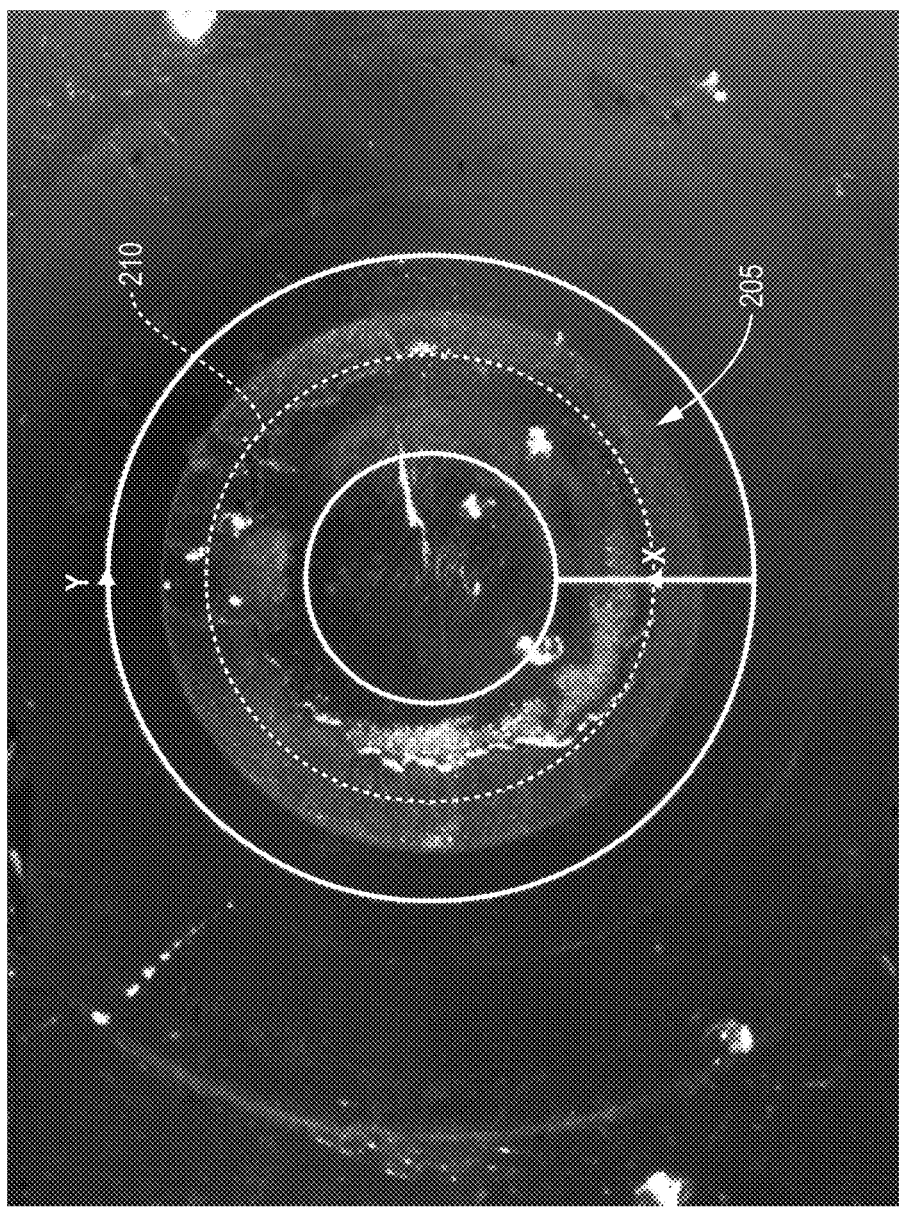
FIG. 2 illustrates an exemplary view of a melted seed in a sapphire boule according to an exemplary embodiment of the present invention.

FIG. 2 shows an exemplary result of a melt back measurement of a seed 205 as viewed by the vision system. The seed 205 is shown to have melted back to position 210 during the boule production process. As such, position 210 may be measured by the vision system as the melt back of the seed 205. From there, the controller may be configured to determine whether the measured melt back 210 is within the predetermined range of acceptable melt back measurements and then the controller may be configured to adjust melting conditions within the furnace accordingly.

Another exemplary embodiment of the present invention provides a method of automatically measuring a seed melt back of a boule. In particular, the method may include lifting a boule using an actuating device onto a support plate to automatically manipulate the boule from a furnace to the support table. The melt back of the seed may be automatically measured using a vision system (e.g., any known vision software) installed on an imaging device (e.g., a camera, a video record, or the like) below a bottom of the boule. The melt back measurement may then be transmitted to a controller to modify subsequent melt conditions within the furnace, if needed.

Once the controller has received the melt back measurement of the seed, the controller may determine whether the measured melt back is a within a predetermined diameter range of about 2.7 to 3.1 inches and more preferably, whether the measure melt back is a predetermined diameter of 2.9 inches. In response to determining that the measured melt back is the predetermined diameter (or within the predetermined diameter range), the boule may be cut into a plurality of wafers. As stated above, when the measured melt back is not within the predetermined diameter, cracking or other imperfections may occur within the boule and the measured melt back may be used to adjust temperature settings within the furnace (e.g., adjust necessary melting conditions). Therefore, it is imperative that the measurements are as accurate as possible. In addition, once the melt back of the seed has been measured, the controller may also be configured to determine whether the boule has a determined crystallographic structure based on the measurement. Specifically, the determined crystallographic structure may be a monocrystalline structure. Therefore, based on the measured melt back of the seed, the controller may be configured to determine whether a determined crystallographic structure has been produced and may cut the boule into a plurality of wafers.

FIG. 3 illustrates an exemplary simplified procedure 300 for measuring a seed melt back of a boule according to an exemplary embodiment of the present invention described herein. The procedure may start at step 305, and continues to step 310, where a boule is lifted by an actuating device onto a support table to automatically manipulate the boule from a furnace to the support table. Once the boule is lifted so that the seed is visible at the bottom of the boule, the melt back of the seed may be automatically measured in step 315 using a vision system that is installed on an imaging device disposed below the boule and support table as shown in FIG. 1. The process may then illustratively end in step 320.

The techniques described herein, therefore, allow for more rapid and accurate measurement of seed melt back due to the automation of lifting the sapphire boule to a support table and measuring the seed melt back using the vision software installed on an imaging device. Thus, a more efficient measuring system is provided herein to measure the seed melt back of a sapphire boule.

The foregoing description has been directed to specific embodiments. It will be apparent; however, that other variations and modifications may be made to the described embodiments, with the attainment of some or all of their advantages. Accordingly, this description is to be taken only by way of example and not to otherwise limit the scope of the embodiments herein. Therefore, it is the object of the accompanying claims to cover all such variations and modifications as come within the true scope of the embodiments herein.

What is claimed is:

1. A method comprising:
   receiving a melt back measurement indicating a melt back of a seed within a boule that is formed inside a crucible of a furnace, wherein a vision system automatically measures the melt back by measuring a diameter of the seed after the boule is formed, the vision system being installed on an imaging device disposed below a bottom of the boule; and
   adjusting a temperature setting of the furnace based on the melt back measurement.

2. The method of claim 1, wherein the adjusting of the temperature setting of the furnace based on the melt back measurement comprises:
   determining whether the melt back of the seed is within a predetermined diameter range based on the melt back measurement.

3. The method of claim 2, further comprising:
   adjusting the temperature setting of the furnace when it is determined that the melt back of the seed is not within the predetermined diameter range.

4. The method of claim 2, further comprising:
   cutting the boule into a plurality of wafers when it is determined that the melt back of the seed is within the predetermined diameter range.

5. The method of claim 2, wherein the predetermined diameter range is from about 2.7 inches to about 3.1 inches.

6. The method of claim 1, wherein the adjusting of the temperature setting of the furnace based on the melt back measurement comprises:
   determining whether the melt back of the seed is a predetermined diameter of about 2.9 inches based on the melt back measurement.

7. The method of claim 1, further comprising:
   determining whether the boule has a determined crystallographic structure based on the melt back measurement.

8. The method of claim 7, further comprising:
   determining whether the boule has a monocrystalline structure based on the melt back measurement.

9. The method of claim 1, wherein the boule is one of a silicon boule and a sapphire crystal boule.

10. The method of claim 1, wherein the imaging device is further disposed below a support table on which the boule is disposed.

11. An apparatus comprising:
    a vision system configured to automatically measure a melt back of a seed within a boule that is formed inside a crucible of a furnace by measuring a diameter of the seed after the boule is formed, wherein the vision system is installed on an imaging device disposed below a bottom of the boule; and
    a controller configured to receive a melt back measurement indicating the melt back of the seed and adjust a temperature setting of the furnace based on the melt back measurement.

12. The apparatus of claim 11, wherein the controller is configured to adjust the temperature setting of the furnace based on the melt back measurement by:
    determining whether the melt back of the seed is within a predetermined diameter range based on the melt back measurement.

13. The apparatus of claim 12, wherein the controller is further configured to adjust the temperature setting of the furnace when it is determined that the melt back of the seed is not within the predetermined diameter range.

14. The apparatus of claim 12, wherein the controller is further configured to cut the boule into a plurality of wafers when it is determined that the melt back of the seed is within the predetermined diameter range.

15. The apparatus of claim 12, wherein the predetermined diameter range is from about 2.7 inches to about 3.1 inches.

16. The apparatus of claim 11, wherein the controller is configured to adjust the temperature setting of the furnace based on the melt back measurement by:
    determining whether the melt back of the seed is a predetermined diameter of about 2.9 inches based on the melt back measurement.

17. The apparatus of claim 11, wherein the controller is further configured to determine whether the boule has a determined crystallographic structure based on the melt back measurement.

18. The apparatus of claim 17, wherein the controller is further configured to determine whether the boule has a monocrystalline structure based on the melt back measurement.

19. The apparatus of claim 11, wherein the boule is one of a silicon boule and a sapphire crystal boule.

20. The apparatus of claim 11, wherein the imaging device is further disposed below a support table on which the boule is disposed.

* * * * *